United States Patent
Geitner et al.

(10) Patent No.: US 9,564,707 B2
(45) Date of Patent: Feb. 7, 2017

(54) CONNECTION SYSTEM WITH MODULAR EXPANSION UNITS HAVING TWO OR MORE DEVICES

(71) Applicant: Siemens Aktiengesellschaft, Munich (DE)

(72) Inventors: Manuel Geitner, Ursensollen (DE); Peter Haubner, Fuerth (DE); Andreas Kneidl, Weiherhammer (DE); Markus Meier, Rieden (DE); Werner Odörfer, Engelthal (DE); Christian Sack, Nabburg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/417,249

(22) PCT Filed: Jul. 18, 2013

(86) PCT No.: PCT/EP2013/065149
§ 371 (c)(1),
(2) Date: Jan. 26, 2015

(87) PCT Pub. No.: WO2014/016190
PCT Pub. Date: Jan. 30, 2014

(65) Prior Publication Data
US 2015/0214657 A1 Jul. 30, 2015

(30) Foreign Application Priority Data
Jul. 27, 2012 (DE) .................. 10 2012 213 258

(51) Int. Cl.
*H05K 7/00* (2006.01)
*H01R 13/627* (2006.01)
*H05K 7/14* (2006.01)

(52) U.S. Cl.
CPC ........ *H01R 13/6272* (2013.01); *H05K 7/1478* (2013.01)

(58) Field of Classification Search
CPC .................................................. H01R 13/6272
(Continued)

(56) References Cited

U.S. PATENT DOCUMENTS 4,790,762 A 12/1988 Harms et al.
5,794,795 A * 8/1998 Stemmons ............... H02B 1/01
211/191

(Continued)

FOREIGN PATENT DOCUMENTS

DE 71 13 834 U 7/1971
DE 37 40 290 A1 6/1989
(Continued)

OTHER PUBLICATIONS

International Search Report PCT/ISA/210 for International Application No. PCT/EP2013/065149 dated Apr. 9, 2014.
(Continued)

*Primary Examiner* — Tulsidas C Patel
*Assistant Examiner* — Peter G Leigh
(74) *Attorney, Agent, or Firm* — Harness, Dickey & Pierce, PLC (57) ABSTRACT

A connection system includes a first connection module and a second connection module, which each have a first connection devices, the first connection module including a second connection device and the second connection module including a third connection device. There is a direct electrical connection between the first connection device of the connection module and the accommodated device and a direct mechanical connection between the connection module and the accommodated device. The first connection module can be locked directly to the third connection device
(Continued)

such that the first connection module is electrically and mechanically connected to the second connection module. The third connection device is arranged such that, when the second connection device is locked to the third connection device, mechanical and electrical disconnection of the first connection module from the second connection module is prevented if the second connection module has received a device.

16 Claims, 5 Drawing Sheets

(58) Field of Classification Search
USPC .................. 439/357, 713, 709, 712, 715
See application file for complete search history.

(56) References Cited

U.S. PATENT DOCUMENTS

| | | | | |
|---|---|---|---|---|
| 6,081,048 A * | 6/2000 | Bergmann | ........... | H05K 7/1472 307/147 |
| 6,172,877 B1 * | 1/2001 | Feye-Hohmann | ...... | G06F 1/184 361/728 |
| 7,544,100 B2 * | 6/2009 | Teitelbaum | .......... | H01R 13/652 439/652 |
| 7,616,453 B2 * | 11/2009 | Bergmann | ............. | H05K 5/061 361/816 |
| 7,704,079 B2 * | 4/2010 | Weiss | ................... | H01R 9/2658 439/607.4 |
| 7,874,856 B1 * | 1/2011 | Schriefer | ............. | H01R 13/514 439/214 |
| 8,207,627 B2 * | 6/2012 | Aldag | .................. | H01R 25/142 307/12 |
| 8,226,444 B2 * | 7/2012 | Chow | .................. | H01R 13/514 439/651 |
| 2001/0027066 A1 * | 10/2001 | Loh | ...................... | H01R 13/514 439/701 |

FOREIGN PATENT DOCUMENTS

| | | |
|---|---|---|
| DE | 199 17 597 A1 | 10/2000 |
| EP | 0 896 504 A2 | 2/1999 |
| WO | WO-00/25560 A1 | 5/2000 |

OTHER PUBLICATIONS

Written Opinion of the International Searching Authority PCT/ISA/237 for International Application No. PCT/EP2013/065149 dated Apr. 9, 2014.

* cited by examiner

CONNECTION SYSTEM WITH MODULAR EXPANSION UNITS HAVING TWO OR MORE DEVICES

PRIORITY STATEMENT

This application is the national phase under 35 U.S.C. §371 of PCT International Application No. PCT/EP2013/065149 which has an International filing date of Jul. 18, 2013, which designated the United States of America, and which claims priority to German patent application no. 102012213258.9 filed on Jul. 27, 2012, the entire contents of each of which are hereby incorporated herein by reference.

FIELD

At least one embodiment of the invention generally relates to a connection system for devices, particularly safety switching devices, in the field of industrial automation technology.

BACKGROUND

In industrial automation, functional and logical links between a plurality of devices are usually implemented by wiring the devices together. For this purpose individual connection points of the devices are interconnected by way of a wire in each case (individual wiring). However, such wiring runs the risk of wiring errors at initial installation, is considerably time-consuming to install initially, constitutes a failure risk in respect of the operated automation system (e.g. due to the cables vibrating loose from the connection points of the devices or due to wire contact problems at the connection point) and, in the case of screw terminals, requires maintenance (tightening of the screws at the connection points of the devices).

DE 37 40 290 A1 discloses a device for the open- and/or closed-loop control of processes in which a plurality of electronic building blocks are combined into sub-assemblies which are each disposed on a bus base module. The bus base modules are clamped to a top-hat rail and have laterally in each case a female multipoint connector which is of complementary design to a male multipoint connector having pins. The male and female multipoint connectors are disposed on opposite sides of the bus base module and are open to the front and back respectively of the bus base module. The bus base modules are connected in a movement perpendicular to a longitudinal axis of the top-hat rail. A mechanical and electrical connection between two adjacent bus base modules is established when the latter are consecutively clamped to the top-hat rail.

The publication U.S. Pat. No. 6,081,048 A discloses a modular expandable peripheral unit having a self-establishing electrical connection, the device being suitable for controlling and monitoring a technical process. The peripheral unit comprises expansion module lower parts EMU and base module lower parts BMU which have a profile permitting side-by-side attachments. Disposed in the base module lower parts BMU are contact elements which project from the base module lower parts BMU as a male multipoint connector. Implemented in the expansion module lower parts EMU are openings through which individual pins of a male multipoint connector can be guided. Viewed from the side, the expansion module lower parts EMU and the base module lower parts BMU have an offset profile. The individual pins of the male multipoint connectors which are accommodated in the expansion module lower parts EMU are disposed in the region of an offset stage so as to prevent lateral pulling-apart of the base module lower parts BMU and expansion module lower parts EMU.

DE 71 13 834 A1 discloses a holder for a plurality of side-by-side disposed electrical equipment units which are each assigned a holder section. Each holder section comprises a base component, a surface of which has mechanical ways of detachably mounting the equipment units. In addition, on opposite lateral surfaces, each base component is provided with mutually complementary connection projections and insertion recesses which are connected to electrical line projections. The electrical line projections allow inserted equipment units to be supplied with electric power. Adjacent base units can be electrically interconnected by being plugged into one another.

U.S. Pat. No. 4,790,762 A discloses an expandable wiring backplane which is designed to accommodate and interconnect electrical equipment units. The wiring backplane comprises a plurality of essentially identical backplane modules which are provided on opposite lateral surfaces with centering pins and tubular recesses in a complementary manner. In addition, electrical blade contacts and contact strips are mounted on opposite side walls of a backplane module. When two backplane modules are pushed together, the centering pins in the tubular recesses ensure that the backplane modules are mechanical aligned to one another. The blade contacts and contact strips of adjacent backplane modules are implemented in alignment with one another so that, when the backplane modules are pushed together, an electrical connection is established between them. Equipment units which are inserted in the backplane modules at right angles to the backplane are supplied with power via this electrical connection. The equipment units inserted in the backplane modules are secured with screws during assembly and their footprint essentially covers the entire user-facing surface of the backplane module.

WO00/25560 A1 discloses a modular connection system for electrical devices which comprises modular mounting units 50 which are fastened to a top-hat rail. On their lateral surface, the modular mounting units have contacts which are designed to establish an electrical connection to an adjacent modular mounting unit. Connections for signal transmission are additionally implemented on the lateral surfaces of the modular mounting units. An electrical device can essentially be inserted perpendicularly to the top-hat rail on an individual modular mounting unit. The modular mounting units are each provided with a toothed rack and a driving pinion. The toothed rack and driving pinion of adjacent modular mounting units engage with one another and ensure interlocking of adjacent modular mounting units on the top-hat rail.

If a safety application is covered by the automation system (e.g. EMERGENCY-STOP shutdown, protective door monitoring or protection of presses or punches), the safety switching devices used in the safety application must fulfil heightened safety requirements. Such safety switching devices are e.g. the SIRIUS 3TK28 equipment made by SIEMENS. By way of such safety switching devices, the following safety oriented functions in particular can be provided:
monitoring of the safety functions of sensors,
monitoring of sensor lines,
monitoring of the correct operation of the safety switching device,
monitoring of actuators for standstill,
safety oriented shutdown of hazards.

SUMMARY

Safety switching devices are therefore the main building blocks of a safety chain within a safety application of an automation system. As the number of inputs required for monitoring the sensors/actuators, and outputs required for outputting a safety signal, may vary depending on the safety system present, a plurality of safety switching devices are functionally and logically linked to one another. Usually the safety switching devices are functionally and logically linked by way of single wiring.

At least one embodiment of the invention is directed to improved, safe interconnection of at least two devices, in particular safety switching devices. In spite of the devices being connected to one another, top-hat rail mounting and/or wall mounting of the devices shall preferably be possible.

Moreover, in the installed, electrically and mechanically interconnected state of at least two devices, it should preferably be possible for one of the devices to be replaced without removing another device or the unit as a whole. In addition, installation between cable ducts at a row pitch of 120 mm is preferably possible.

At least one embodiment is directed to a connection system for electrical devices, comprising a first and a second connection module, each having a first connection device, wherein the first connection module has a second connection device and the second connection module has a third connection device, wherein the first and the second connection module can each accommodate a device so that, when the device and the connection module are in the coupled state, there is a direct electrical connection between the first connection device of the connection module and the accommodated device and a direct mechanical connection between the connection module and the accommodated device, wherein the first connection module can be directly locked by its second connection device to the third connection device of the second connection module so that, in the locked state, the first connection module is electrically and mechanically connected to the second connection module, wherein the third connection device is disposed and implemented such that, when the second connection device and the third connection device are in the locked state, mechanical and electrical disconnection of the first connection module from the second connection module is prevented if the second connection module has received a device.

Advantageous further developments of the invention are set forth in the dependent claims.

BRIEF DESCRIPTION OF THE DRAWINGS

The invention and embodiments of the invention will now be described and explained in greater detail with reference to the examples illustrated in the accompanying drawings in which.

DETAILED DESCRIPTION OF THE EXAMPLE EMBODIMENTS

An advantage of at least one embodiment of the invention is that individual wiring between the devices can be dispensed with. For electrical and mechanical interconnection of the individual devices, initially only the individual connection modules need to be coupled together. The second connection device of the first connection module is directly locked to the third connection device of the second connection module. By coupling the two connection modules together, an electrically conductive connection is established between the second and third connection devices. For this purpose the second and third connection device each comprise at least one electrical contact element. By coupling the two connection modules together, the at least one contact element of the second connection device makes contact with the at least one contact element of the third connection device. In addition, the connection modules are mechanically interconnected by the locking together of the connection modules. This connection is in particular a mechanically releasable connection; i.e. the first connection module can be disconnected again from the second connection module without destroying the first or second connection module. However, for nondestructive disconnection of the first connection module from the second connection module, the second connection module must not have received a device.

The first connection device of the first connection module is electrically connected to the second connection device of the first connection module. The first connection device of the second connection module is electrically connected to the third connection device of the second connection module.

For electrically connecting a first device to a second device, the devices need only be coupled to two already interlocked connection modules. For this purpose the first device is coupled to the first connection module and the second device to the second connection module. Coupling of the devices to the associated connection module brings the device, in particular a connection point of the device, into electrical contact with the first connection device of the associated connection module. The devices are preferably coupled to the connection module by way of a locking arrangement (latching connection).

Coupling of the second connection module to a device causes the third connection device to be blocked so as to prevent mechanical disconnection of the third connection device from the second connection device. This makes it possible to ensure that accidental breaking of the electrical connection between two devices which are interconnected by way of the first and second connection device is prevented.

In particular, the connection system provides reliable, clearly arranged mechanical and electrical interconnection of two devices.

In an advantageous further development of an embodiment of the invention, the first connection module is of identical construction to the second connection module. The first and second connection module therefore each have the second electrical connection device on one side and the third electrical connection device on the opposite side.

Due to the fact that the connection modules are of identical design, the connection system can be expanded as required. For reliably connecting three devices electrically and mechanically, only three connection modules therefore need to be interconnected and the individual devices then coupled to one of the connection modules in each case.

In particular, the first connection device of a connection module is connected in an electrically conductive manner inside the device to the second connection device and the third connection device. In particular, the first connection device comprises at least one first contact element which is connected in an electrically conductive manner to a contact element of the second connection device, and at least one second contact element which is connected in an electrically conductive manner to a contact element of the third connection device.

In particular, if the connection module has not received a device, there is no electrically conductive connection between the contact elements of the second and third connection device of the connection module. Mounting a device in the connection module causes an electrically conductive connection to be present between the second and third connection device depending on the state of the accommodated device.

When two connection modules are mechanically coupled, the contact element of the second connection device is connected in an electrically conductive manner to the associated contact element of the third connection device.

In another advantageous embodiment of the invention, the first and second connection module each comprise a latching device enabling the mechanical connection to the device to be established. The latching device is preferably implemented as a snap-on device. In particular, the connection module comprises at least one snap lug for this purpose.

The direct mechanical connection of the connection module to the device is preferably a releasable snap-on connection.

In another advantageous embodiment of the invention, the first and second connection module each have a top-hat rail mount. In particular, the top-hat rail mount is opposite the side having the first connection device. The connection module can be fastened, in particular locked, to a top-hat rail by way of the top-hat rail mount. This provides extremely flexible mounting of the devices by way of the connection module.

The device is preferably in mechanical contact with the connection module via the housing base of the device. This ensures particularly clearly arranged installation of the devices. The device preferably likewise has a top-hat rail mount on the housing base.

The top-hat rail mount of the connection module and/or of the device is in particular implemented so as to provide a releasable connection to a 35 mm top-hat rail having a depth of 15 mm or 7.5 mm.

In another advantageous embodiment of the invention, the direct mechanical connection between the first connection module and the second connection module is in the form of a releasable snap-on connection.

In another advantageous embodiment of the invention, the second connection device has a snap lug which can engage in a snap lug counterpart of the third connection device. The connection modules are therefore mechanically interconnected by way of a snap-on connection between the snap lug and the snap lug counterpart.

In another advantageous embodiment of the invention, part of the third connection device is deflected during mechanical coupling of the first connection module to the second connection module.

In particular, during coupling, the part of the third connection device is deflected into the region of the connection module which is occupied by the device when it and the connection module are in the coupled state. This region will be hereinafter be referred to as the device region.

The deflected part of the third connection device preferably incorporates the snap lug counterpart so that, during coupling of the first connection module to the second connection module, the snap lug counterpart (e.g. a tab in which the snap lug can engage) is deflected, in particular into the device region.

If the second connection module has already been coupled to a device, the first connection module cannot be locked via its second connection device to the third connection device of the second connection module, as any deflection of the part of the second connection module is prevented by the accommodated device.

If the first connection module has been locked via its second connection device to the third connection device of the second connection module and the second connection module has then been coupled to a device, the device region is occupied by the accommodated device. It is impossible for the first connection module to be separated from the second connection module, as part of the third connection device must be deflected into the device region for this purpose. However, this device region is occupied by the accommodated device.

If the device is coupled to/accommodated by the connection module, the device is in particular locked to the connection module in such a way that accidental detachment of the device from the connection module is prevented.

When coupled to a device, the connection module which is connected by way of its third connection device to an equivalent connection module cannot therefore be separated from the equivalent connection module. If the accommodated device is removed from the connection module, the two connection modules can be separated from one another.

A connection system of this kind can therefore ensure reliable mechanical and electrical interconnection of two devices.

It is self-evident that the locking of the second connection device to the third connection device can take place inversely. Instead of the deflection of part of the third connection device of the second connection module during the mechanical connection of the second connection device of the first connection module, part of the second connection device can likewise be implemented such that it is deflected into the device region of the second connection module during mechanical connection to the third connection device. The second connection device would therefore be disposed and implemented such that, when the second connection device and the third connection device are in the coupled state, mechanical and electrical separation of the first connection module from the second connection module is prevented if the second connection module has received a device.

In another advantageous embodiment of the invention, the first and second connection module each have a fastening device for fastening the connection module by way of a screw.

The fastening device for e.g. wall-mounting the connection module is preferably implemented by a cutout via which the connection module can be fastened, e.g. bolted, to the wall.

In another advantageous embodiment of the invention, the second and third connection devices of a connection module each comprise at least two electrical contact elements which are each guided to a contact element of the first connection device inside the device.

In another advantageous embodiment of the invention, the connection system comprises a third connection module having a first connection device, wherein the third connection module can accommodate a device so that, when the device and the third connection module are in the coupled state, there is a direct electrical connection between the first connection device of the third connection module and the accommodated device and a direct mechanical connection between the third connection module and the accommodated device, wherein the third connection module has a third connection device, wherein the second connection device of the first or second connection module can be locked directly to the third connection device of the third connection module so that, in the locked state, the second connection device of the first or second connection module is electrically and mechanically connected to the third connection module, wherein the third connection device is disposed and implemented such that, when the second connection device and the third connection device are in the locked state, mechanical and electrical separation of the connection module of the second connection device from the third connection module is prevented if the third connection module has received a device, wherein the third connection module comprises a termination device whereby electrical contact elements of the first connection device can be interconnected.

The third connection device of the third connection module is in particular of identical construction to the third connection device of the second and/or first connection module.

Contact elements of the first connection device of the third connection module are preferably guided to the third connection device of the third connection module inside the device.

The third connection module can therefore be used as a terminating connection module. Due to the fact that the termination device enables electrical contact elements of the first connection device to be interconnected, incoming electrical signals via the third connection device can be fed via the first connection device to the accommodated device. The first device can evaluate the electrical signals and then output them to the first connection device. The signals otherwise fed to the second connection device of the equivalent connection module are now interconnected within the device in the third connection module by way of the termination device so that they can be fed back to the first connection device.

An enabling circuit controlled via the device of the first connection module and thereby monitored feedback circuit can therefore be fed back by way of the termination device, so that appropriate evaluation can take place on the part of the device of the first connection module. The termination device is preferably a switch which, in a first position, establishes an electrically conductive connection between contact elements of the first connection device and, in a second position, prevents an electrically conductive connection between contact elements of the first connection device.

The connection modules are preferably implemented such that they can each accommodate an identical device.

In another advantageous embodiment of the invention, a system has a connection system and a first and second device present. The first device can be coupled to the first connection module and the second device to the second connection module.

The devices are preferably of identical construction in respect of locking to the connection module.

The first and second device is preferably an electrical device in each case, in particular a safety switching device. The following safety-related functions can preferably be provided by the safety switching device:

monitoring of the safety functions of sensors,
monitoring of sensor lines,
monitoring of the correct operation of the safety switching device,
monitoring of actuators for standstill,
safety oriented shutdown of hazards.

The safety system preferably comprises a basic module as a first safety switching device and an expansion module as a second safety switching device.

The basic module preferably comprises safety inputs, safety outputs and an evaluation unit. The evaluation unit is used to read in the safety inputs and set the safety outputs.

The basic module preferably comprises an interface module by which the basic module can communicate with a higher-order control system (e.g. via PROFIBUS or AS interface). The entire safety program of a safety application is preferably executed in the basic module.

The expansion module enables the safety system to be flexibly adapted to the required safety applications. The number of available safety inputs and/or safety outputs can be increased by the expansion module. The safety system can preferably be expanded to include a plurality of expansion modules. It is merely necessary to interconnect a plurality of connection modules in order to electrically and mechanically interconnect the safety switching units.

In another advantageous embodiment of the invention, the first device is a basic module and the second device an expansion module, wherein, in the state in which the basic module and the first connection module, the expansion module and the second connection module, and the first connection module and the second connection module are in the coupled state, the basic module can output an electrical signal to the expansion module via the first and second connection module.

The basic module preferably comprises an evaluation unit by which an enabling circuit and feedback circuit of the safety system can be evaluated.

The outputting of a signal at a safety output of the expansion module is in particular controlled by the basic module only.

In another advantageous embodiment of the invention, the first and second device each comprise a circuit board having an electrically conductive contact surface, wherein the device makes direct electrical contact with the first connection point via the electrically conductive contact surface on the circuit board.

In another advantageous embodiment of the invention, the device has a contact point in the region of the top-hat rail mount, enabling the device to make electrical contact with the first connection point. The contact point is in particular disposed on the device in the region of the recess formed by the top-hat rail mount. This enables an extremely compact device unit to be formed between the connection module and the device accommodated in the connection module. The connection system is preferably designed such that only one plug-in surface (e.g. via the circuit board) needs to be provided. The plug-in technology itself is built into the connection module via the first connection device. This enables additional device costs to be avoided.

Figure 1:
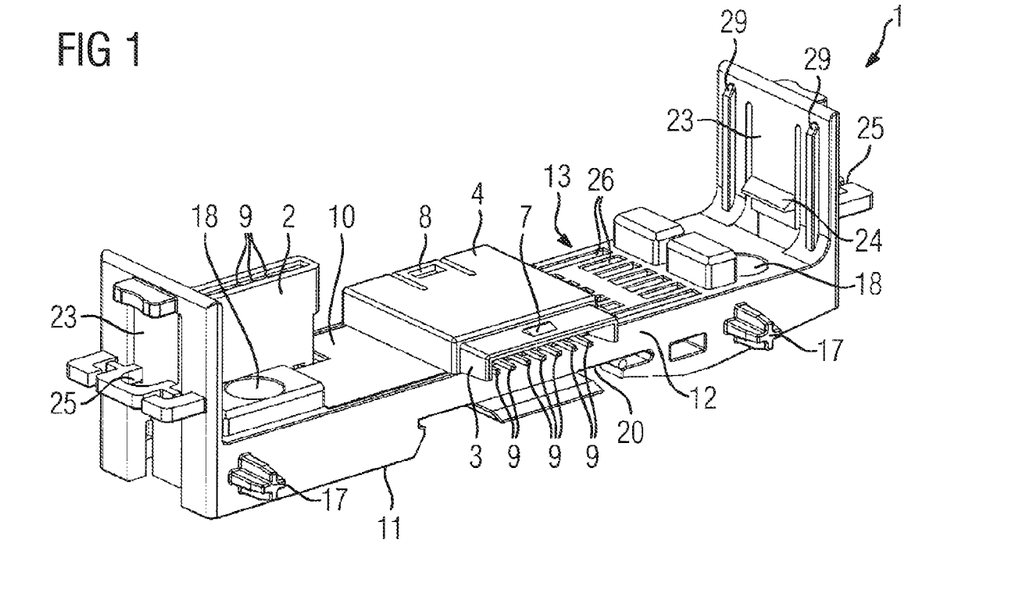
FIG. 1 schematically illustrates a first connection module.

FIG. 1 schematically illustrates a first connection module 1. The second connection module is preferably of identical construction to the first connection module 1 shown. For mechanical and electrical connection to a device, in particular a safety switching device, the first connection module 1 has, on its first side 10, a first connection device 2 and two snap-on devices 23. The mechanical releasable connection of the device to the connection module is provided in particular by a snap-on mechanism. To accommodate and guide the device in the connection module 1, the connection module 1 has two projections 29 on its snap-on device 23. When the device is inserted in the connection module 1, the snap lug 24 of the snap-on device 23 locks with an associated snap lug counterpart on the device. The snap lug counterpart is implemented in particular by a recess on the device. To release an accommodated device from the connection module 1, the snap-on devices 23 can each be deflected via a receiving device 25 so that the mechanical locking between the device and the connection module 1 is released.

Mechanical insertion of the device in the connection module 1 brings the first connection device 2 into electrical contact with the device. For this purpose, the first connection device 2 comprises contact elements which are brought into contact with contact points of the device by the inserting of the device in the connection module so that an electrically conductive connection is provided between the contact elements and the associated contact points. The first connection device 2 comprises fourteen contact elements 9, of which seven first contact elements 9 are disposed opposite seven second contact elements 9. The individual contact elements 9 are electrically isolated from one another in the first connection device 2. Electrical contact between the device and the first connection device is established via a circuit board of the device. For each contact element 9 of the first connection device 2, the circuit board has an electrically conductive contact surface on the outer side of the circuit board for this purpose. Inserting the device in the connection module 1 causes part of the circuit board to be moved into the first connection device 2, so that the circuit board is disposed with its contact surfaces between the seven opposite contact elements 9 in such a way that each contact element 9 of the first connection device 2 makes contact in an electrically conductive manner with a separate contact surface of the circuit board.

The first side 10 and the second side 11 opposite the first side 10 of the connection module 1 has a fastening device opening 18. The fastening device opening 18 is formed by two openings 18. The connection module 1 can therefore be fixed e.g. to a wall by way of the two openings 18 using two screws. The device can then be inserted so that the device is wall-mounted via the connection module 1.

Alternatively to mounting the connection module 1 via the fastening device 18, the connection module 1 has on its second side 11 a top-hat rail mount 20. The top-hat rail mount 20 is implemented in particular by a top-hat rail latching device on its second side 11. By way of the top-hat rail latching device 20, the connection module 1 can be locked to a top-hat rail in a mechanically releasable manner via its second side 11.

A plurality of openings 26 are provided between the first and second side 10,11 of the connection module 1. With a device inserted, the openings 26 enable heat to be optimally dissipated from the device.

On a third side 12, the connection module 1 has second connection device 3. The second connection device 3 projects from the third side 12. Additionally disposed on the third side 12 are pins 17 which are used to mechanically connect the connection module 1 to another connection module (which is of identical construction to the first connection module 1). For this purpose the first connection module 1 has corresponding recesses on its fourth side 13, which is opposite the third side 12, so that the pins 17 and recess provide both guidance for coupling two connection modules 1 and a mechanical force interchange between two coupled-together connection modules 1.

The second connection device 3 comprises seven contact elements 9, each implemented as a contact pin, and a snap lug 7. Each of the seven contact elements 9 of the second connection device 3 is connected inside the device to a contact element 9 of the seven first contact elements 9 of the first connection device 2 in each case. Seven device-internal electrically isolated connections between the first connection device 2 and the second connection device 3 are therefore present, wherein an electrically conductive connection to a separate contact element 9 of the second connection device 3 is therefore established for each contact element 9 of the first contact elements 9 of the first connection device 2.

On the fourth side 13, the connection module 1 has a third connection device 4. The third connection device 4 is formed by a recess on the fourth side 13. The recess is designed so that when two connection modules 1 are snapped together it corresponds with the second connection device of the other connection module 1 projecting from the third side 12 such that the second connection device 3 is accommodated in the third connection device 4.

The third connection device 4 comprises seven contact elements 9, each implemented as a contact jack for receiving a contact pin of the second connection device 3, and a snap lug counterpart 8 which is implemented as a tab. Each of the seven contact elements 9 of the third connection device 4 is connected inside the device to a contact element 9 of the seven second contact elements 9 of the first connection device 2 in each case. Seven device-internal electrically isolated connections between the first connection device 2 and the third connection device 4 are therefore present, an electrically conductive connection to a separate contact element 9 of the third connection device 4 therefore being established for each contact element 9 of the first contact elements 9 of the first connection device 2.

If no device is mounted in the connection module 1, the contacts 9 of the second connection device 3 are not connected to the contacts 9 of the third connection device 4. If a device is mounted in the connection module 1, an electrically conductive connection between the contact elements 9 of the second and third connection device 3, 4 is present depending on the switching state of the accommodated device.

The first connection module 1 can be coupled and locked to a connection module 1 of identical construction. For this purpose, the third side 12 of the first connection module 1 is pushed onto the fourth side 13 of the other connection module 1 so that the second connection device 3 is pushed into the third connection device 4. In doing so, the tab 8 of the third connection device 4 is initially deflected by the snap lug 7 of the second connection device 3 in the direction of the region occupied by the accommodated device until the snap lug 7 engages in the opening of the tab 8.

To mechanically separate the two interlocked connection modules 1, the tab 8 must be lifted so that the second connection device 3 can be withdrawn from the third connection device 4.

The coupling of the two connection modules 1 causes the contact pins 9 of the second connection device 3 to be pushed into the associated contact jacks 9 of the third connection device 4 so that an electrically conductive connection is established between the first connection device 2 of the two connection modules.

Figure 2:
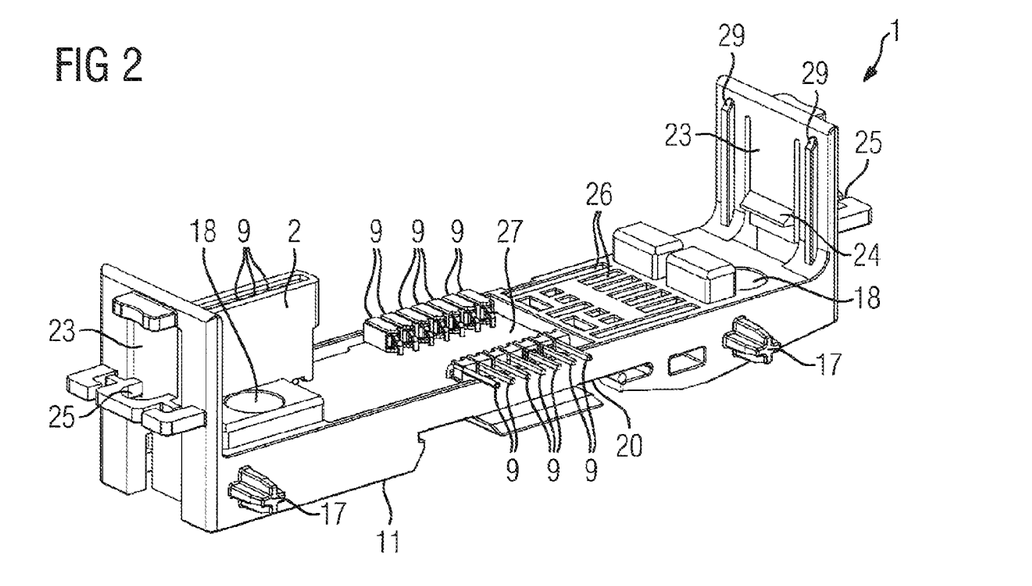
FIG. 2 shows another schematic representation of the first connection module according to FIG. 1, FIG. 3 schematically illustrates a third connection module.

FIG. 2 shows another schematic representation of the first connection module 1 of FIG. 1. In the case of the connection module 1 shown, only one housing section of the first side 10 of the connection module 1 has been removed so that the contact elements 9 of the second and third connection devices 3,4 are visible. The contact elements 9 of the second and third connection devices 3,4 are mounted on a circuit board 27 and connected via the latter to the contact elements 9 of the first connection device 2. The contact elements 9 of the second connection device 3 are contact pins 9 each case. The contact elements 9 of the third connection device 4 are contact jacks which can accept contact pins 9 of the second connection device 3 of another connection module 1 of identical design.

Figure 3:
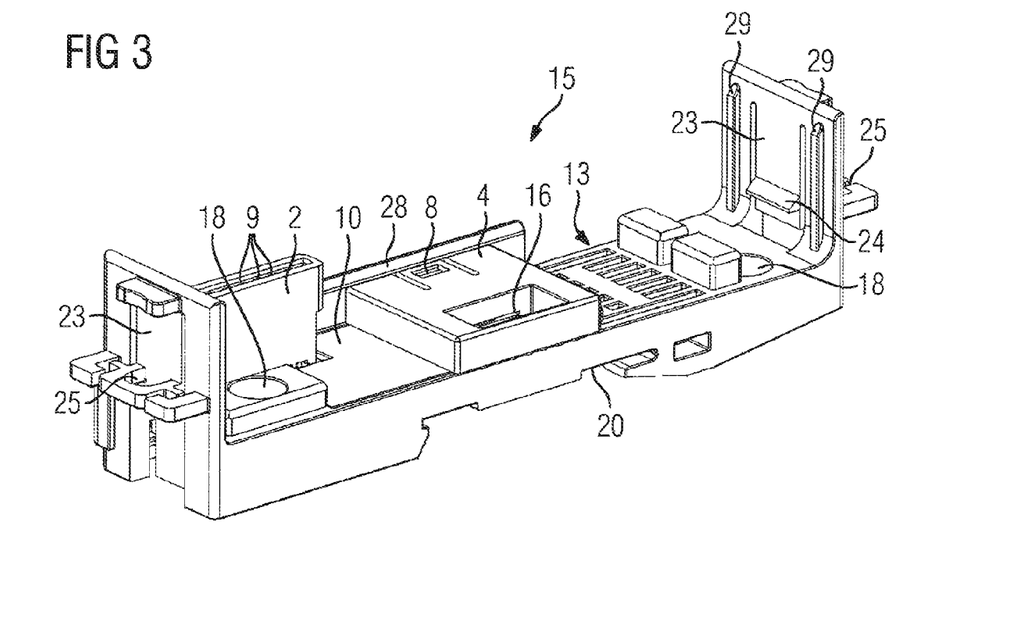
Figure 4:
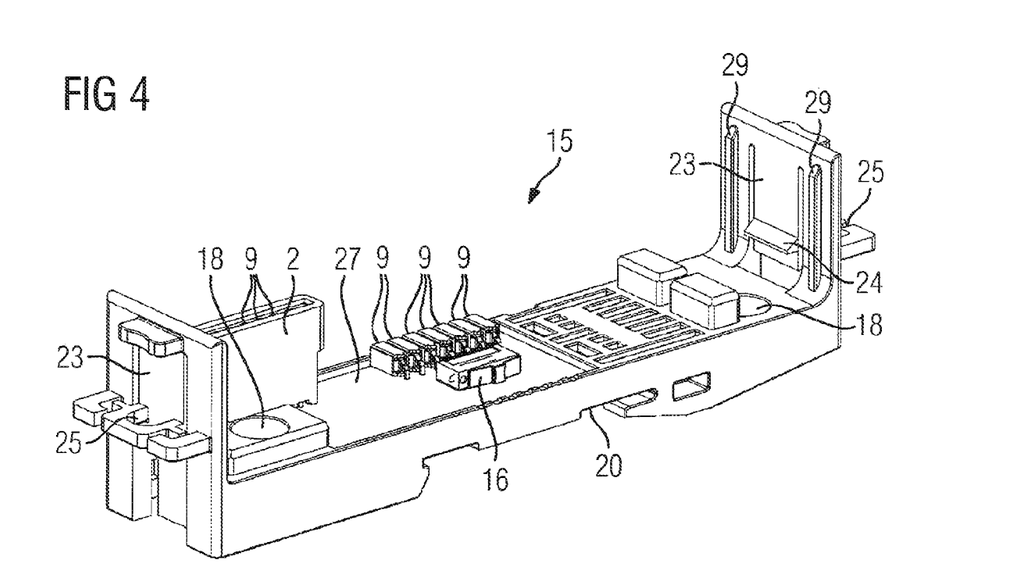
FIG. 4 shows another schematic representation of the third connection module according to FIG. 3.

FIG. 3 schematically illustrates a third connection module 15. FIG. 4 shows another schematic representation of the third connection module 15 of FIG. 3. In FIG. 4, only one housing section of the first side 10 of the third connection module 15 has been removed. The third connection module 15 is of virtually identical design to the first connection module 1 of FIGS. 1 and 2. The third connection module 15 can accommodate the same devices as the first connection module 1. In addition, the third connection module 15 can be coupled via its fourth side 13 to a first connection module, in particular via the third side thereof, so that the third connection device 4 of the third connection module 15 is locked to the second connection device of the first connection module 1. Compared to the first connection module 1 according to FIGS. 1 and 2, the third connection module 15 has no third connection device. Instead of the third connection device, the third connection module 15 comprises a termination device 16. In addition, a facing 28 is provided in front of the second connection device 4 and the third connection module 15 has no protruding contours (e.g. the pins of the first connection module 1) on the right-hand side, thereby enabling the next device to be closely attached. The third connection module 15 is used in particular as a termination module for the connection system. The first connection module 1 can be coupled to a plurality of other first connection modules, so that signals can always be exchanged between a connection module and the equivalent connection module. This enables a plurality of devices to be mechanically and electrically interconnected. By way of the third connection module 15, signals received via the third connection device 4 of the third connection module 15 can be fed back to the third connection device 4 of the third connection module 15 by way of the termination device 16 which is implemented as a switch. In particular, two contact elements 9 of the second contact elements 9 of the first connection device 2 are interconnected or not depending on the position of the switch 16.

Depending on the respective place of use (e.g. termination basic device or contact extension), the required switch setting for the safety system constituted by the devices can therefore be selected via the switch 16.

Figure 5:
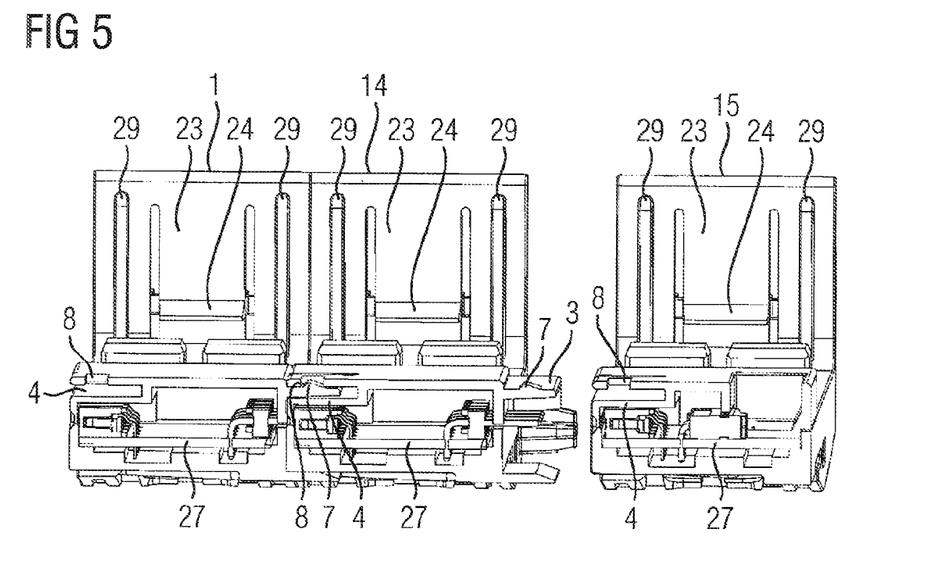
FIG. 5 shows a schematic cross-sectional view of three connection modules, FIG. 6 schematically illustrates part of a plan view of the three connection modules according to FIG. 5.
Figure 6:
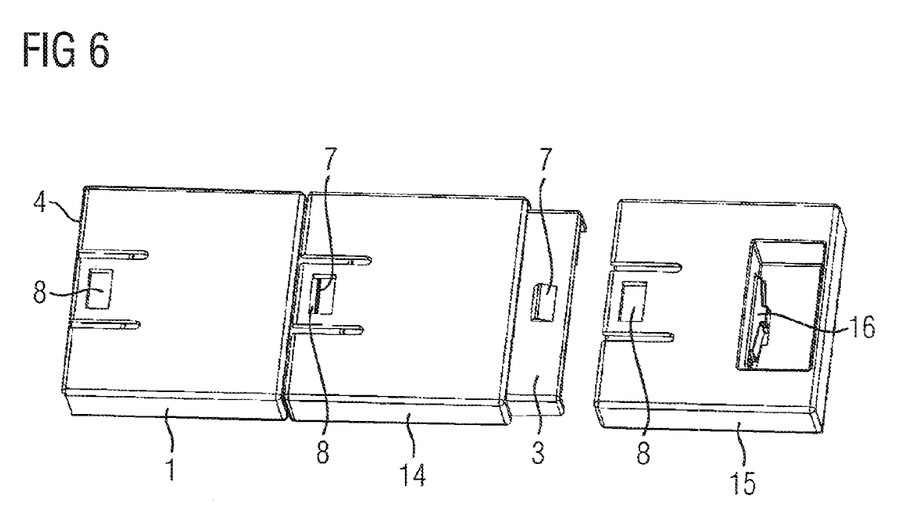

FIG. 5 shows a schematic cross-sectional view of three connection modules 1,14,15. FIG. 6 schematically illustrates part of a plan view of the three connection modules 1,14,15 of FIG. 5. This shows a first connection module 1 according to FIGS. 1 and 2, a second connection module 14 which is of identical construction to the first connection module 1, and a third connection module 15 according to FIGS. 3 and 4. The first connection module 1 is locked to the second connection module 14, i.e. the second connection device 3, in particular the snap lug 7 thereof, of the first connection module 1 is locked to the third connection device 4, in particular to the snap lug counterpart 8 thereof, of the second connection module 14. The two connection modules 1,14 are therefore permanently mechanically interconnected. As a result of the coupling of the first connection module 1 to the second connection module 14, the contact elements of the second connection device 3 of the first connection module 1 have also been connected in an electrically conductive manner to the associated contact elements of the third connection device 4 of the second connection module 14.

Figure 7:
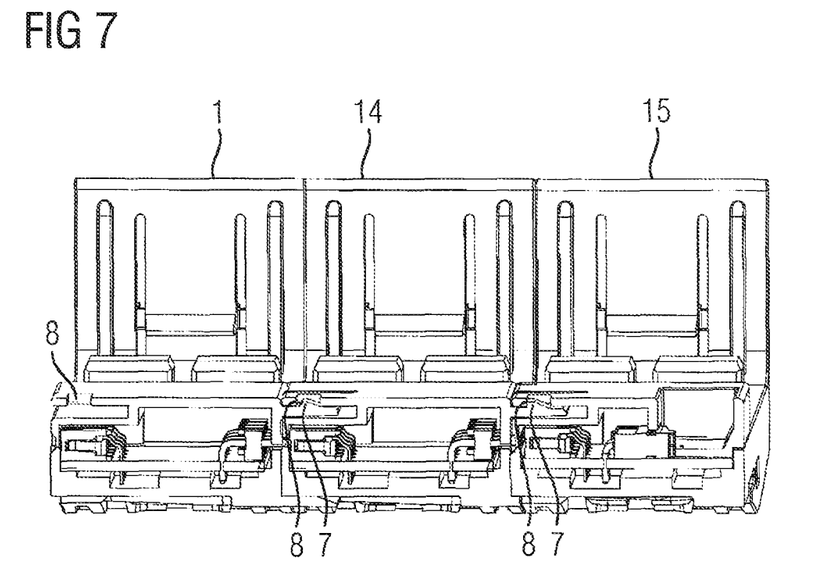
FIG. 7 shows a schematic cross-sectional view of three interlocked connection modules, and FIG. 8 schematically illustrates a system comprising three connection modules and three devices.

The third connection module 15 is not yet coupled to the right-side section (the third side 12) of the second connection module 14. To couple the second connection module 14 to the third connection module 15, the second connection device 3 of the second connection module 14 must be pushed into the third connection device 4 of the third connection module 15. The pushing-in of the second connection device 3 of the second connection module 14 causes part of the third connection device 4 to be deflected by the snap lug 7 of the second connection device 3. Only when the snap lug 7 projects into the opening 8 (snap lug counterpart) of the third connection device 4 does the deflected part of the third connection device 4 assume its original position. The snap lug 7 is therefore locked via the opening 8 so as to establish a mechanically stable connection between the second and third connection module 14,15. This state is shown by FIG. 7. In FIG. 7 the first connection module 1 is locked to the second connection module 14 and the second connection module 14 to the third connection module 15.

To disengage three connection modules 1,14,15, the part of the second connection device 4 which is deflected by the snap lug 7 during the locking process must be deflected in each case. However, as soon as e.g. the second connection module 14 is coupled to a device, i.e. the device is pushed onto the first side of the second connection module 14 via the projections 29 until the snap lug 24 of the connection module 14 locks with the corresponding recess on the device, the second connection module 14 can no longer be separated from the first connection module 1, as the part of the second connection device 4 which is deflected during the locking process can no longer be deflected.

In the corresponding connection module 1,14,15, the accommodated device therefore occupies the space which is required for deflecting the part of the third connection device 4 when the third connection device 4 is coupled to the equivalent second connection device 3.

As soon as the lower section of the device, 2, 3, 4 is coupled to the connection module, separation of the connection module 1,14,15 from the left-hand-side connection module 1,14 is no longer possible, as the lower section of the device prevents the opening of the tab 8. To detach the connection module 1,14,15 from the left-side-coupled connection module 1,14, the device must therefore first be removed from the connection module 1,14,15.

A device mounted on a connection module 1,14,15 therefore prevents the snap lug counterpart 8 (here tab) of the third connection device 4 of the connection module 1,14,15 from lifting, so that unlatching of the snap-in hook 7 from the tab 8 is prevented. If no device is mounted on the connection module 1,14,15, the corresponding connection module 1,14,15 can be detached.

Figure 8:
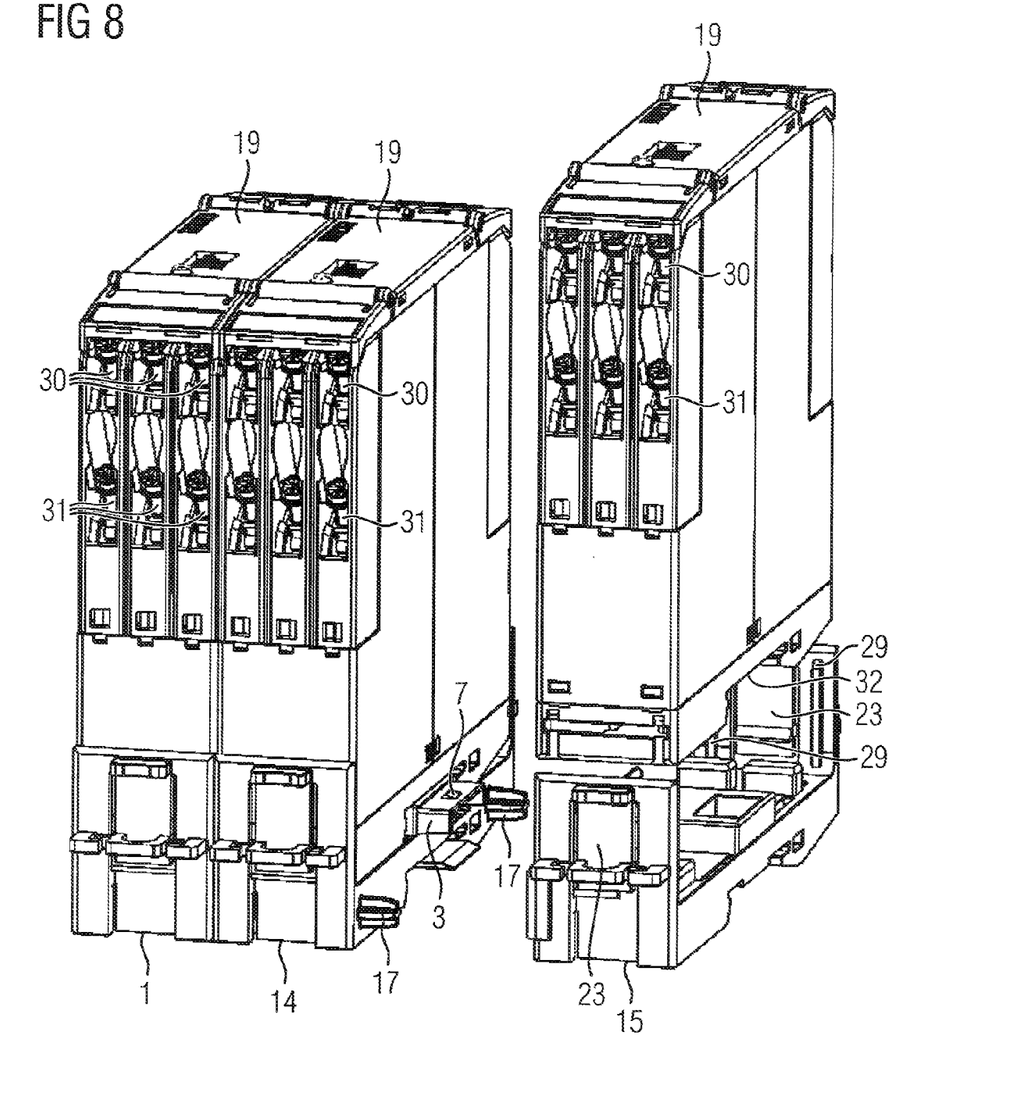

FIG. 8 schematically illustrates a system comprising three connection modules 1,14,15 and three devices 19. The first connection module 1 and second connection module 14 correspond to the connection module shown in FIGS. 1 and 2. The third connection module 15 corresponds to the connection module shown in FIGS. 3 and 4. The device 19 is a safety switching device in each case, wherein the device 19 coupled to the first connection module 1 is a basic device 19 which comprises a processing unit and sets and monitors the safety inputs 30 and safety outputs 31 of the devices 19. Enabling of the enabling circuit and monitoring of the feedback circuit take place in the basic device 19. The basic device 19 itself likewise has safety inputs 30 and safety outputs 31. Signals from actuators and sensors can be detected by way of the safety inputs. Signals to switching devices (e.g. contactor, or relays), in particular, can be output by way of the safety outputs 31.

The device 19 coupled to the second connection module 14 is an expansion module 19 of the basic device 19. The expansion module 19 enables the number of safety inputs 30 and safety outputs 31 provided by the basic device 19 to be increased. No logical evaluation of the signals received via the safety inputs 30 of the expansion module 19 takes place in the expansion module 19 itself. The expansion module 19 forwards such signals via the connection to the first connection device of the second connection module 14 to the basic device 19 so that the latter can evaluate the signal and respond accordingly. The expansion module 19 also has safety outputs 31 via which switching devices can be controlled. The signals for this purpose originate from the basic module 19 and are transmitted via the first and second connection module 1,14 to the expansion module 19 of the second connection module. The signals of the basic device are not evaluated by the expansion module 19. The connection modules 1,14,15 make communication between the devices 19 possible. In particular, communication in respect of the enabling circuit and feedback circuit of the basic module 19 takes place via the electrical connection of the devices 19 to the connection modules 1,14,15 (by way of the first connection device) and between the connection modules (by way of the second and third connection device).

The third connection module 15 is not yet connected to the second connection module 14. In addition, the device 19 of the third connection module 15 is not yet coupled to the third connection module 14. The device 19 of the third connection module 15 is likewise an expansion module 19 having safety inputs 30 and safety outputs 31.

The electrical interconnection and the connection to the accommodated devices 19 is therefore established by way of the connection modules 1,14,15, thereby obviating the need for individual wiring of the devices 19 to one another.

The contact elements of the connection modules 1, 14, 15 are protected from damage by contours on the plastic parts of the connection device.

The connection modules 1,14,15 are mechanically positioned with respect to one another by way of plastic pins 17 and corresponding openings. The connection modules 1,14, 15 are held in position in a form-fit manner with respect to one another by the latching connection between the connection modules via the second connection device 3 to the third connection device 4. The latching connection can be interlocked by the inserted devices 19 so that the assembled connection modules 1,14,15 cannot come apart during operation.

The connection modules 1,14,15 additionally have screw fastening points (fastening device opening 18) by which the connection module 1,14,15 can be bolted to a wall.

The third connection module 15 is used to terminate the connection system.

The devices 19 are standard devices which can be locked to a top-hat rail via a top-hat rail mount 32 incorporated into the device 19 even without the connection system.

To accommodate a device 19 in the connection module 1,14,15, the device 19 is guided by corresponding projections 29 on the connection module 1,14,15. The device 19 interlocks with the snap-on device 23 mounted on the upper and lower side of the connection module 1,14,15. The individual devices 19 are connected to the connection module 1,14,15 via a plug-in connection to the first connection device. A circuit board having electrically conductive contact surfaces engages in the first connection device of the connection module such that the contact surfaces of the circuit board are in direct contact with the contact elements of the first connection device. The contact elements of the first connection device are in particular spring mounted. In addition, the electrically conductive contact surfaces are disposed on both sides of the circuit board. The contact points are preferably Sn or Au coated.

The connection system provides protective routing of the device connecting lines. This enables faults (e.g. lines vibrated loose, defective clamping points) in safety system applications to be eliminated. During assembly, wiring errors for the connection between the devices 19 can be eliminated. This reduces the time and effort for troubleshooting and fault clearance for the installer. Due to the arrangement of the connection modules 1,14,15, devices 19 can be removed from the assembly from the front, without having to remove the entire equipment assembly from the switchgear cabinet.

The connection modules 1,14,15 and the devices 19 are implemented such that they can be mounted on a 35 mm top-hat rail (flat depth=15 mm and high rail depth=7.5 mm) or can be wall mounted (by bolting) without additional parts.

The enforced interlocking of the connection modules 1,14,15 reliably prevents the assembly from being accidentally separated. At the same time it is easily possible to separate the assembly with the devices removed.

The connection system can likewise be installed as standing wiring (placeholders) in the switchgear cabinet without devices.

The invention claimed is:

1. A connection system for electrical devices, comprising;
   first and second connection modules, each of the first and second connection module including a first connection device, the first connection module further including a second connection device and the second connection module further including a third connection device, the first and second connection modules each being able to accommodate a device so that, when the accommodated device and the first or second connection module are in a coupled state, there is a direct electrical connection between the first connection device of the first or second connection module and the accommodated device and a direct mechanical connection between the first or second connection module and the accommodated device,
   wherein the second connection device of the first connection module is configured to directly lock to the third connection device of the second connection module so that, in the coupled state, the first connection module is electrically and mechanically connected to the second connection module,
   wherein the third connection device is disposed and implemented such that, when the second connection device and the third connection device are in the coupled state, mechanical and electrical disconnections of the first connection module from the second connection module is prevented if the second connection module has received the accommodated device,
   wherein the second connection device includes a snap lug which is configured to latch into a snap lug counterpart of the third connection device, wherein the snap lug counterpart is deflected into a region which is occupied by the received device during mechanical coupling of the first connection module to the second connection module, and wherein the first and second connection modules each includes a top-hat rail mount.

2. The connection system of claim 1, wherein the first connection module is of identical construction to the second connection module.

3. The connection system of claim 2, wherein the first and second connection module, each comprises a latching device configured to establish the direct mechanical connection to the accommodated device.

4. The connection system of claim 2, wherein the direct mechanical connection between the first connection module and the second connection modules comprises a detachable snap-on connection.

5. The connection system of claim 2, further comprising:

a third connection module, including a first connection device, the third connection module configured to accommodate a device so that when the device and the third connection module are in the coupled state, there is a direct electrical connection between the first connection device of the third module and the accommodated device and a direct mechanical connection between the third connection module and the accommodated device, wherein the third connection module includes a third connection device, wherein the second connection module comprises a second connection device, the second connection device of the first or second connection module is configured to directly lock to the third connection device of the third connection module so that, in the locked state, the second connection device of the first or second connection module is electrically and mechanically connected to the third connection module, wherein the third connection device is disposed and implemented such that, when the second connection device and the third connection device are in the locked state, mechanical and electrical separations of the second connection device from the third connection module are prevented if the third connection module has received an accommodated device, and wherein the third connection module comprises a termination device enabling electrical contact elements of the first connection device to be interconnected.

6. The connection system of claim 1, wherein the first and second connection modules each comprises a latching device configured to establish a direct mechanical connection to the accommodated device.

7. The connection system of claim 1, wherein the direct mechanical connection between modules comprises a detachable snap-on connection.

8. The connection system of claim 1, wherein the second and third connection devices each comprises at least two electrical contact elements, each configured to be guided inside the accommodated device to a contact element of the first connection device.

9. The connection system of claim 1, further comprising:

a third connection module, including a first connection device, the third connection module being able to accommodate a device so that when the device and the third connection module are in the coupled state, there is a direct electrical connection between the first connection device of the third module and the accommodated device and a direct mechanical connection between the third connection module and the accommodated device, wherein the third connection module includes a third connection device, wherein the second connection module comprises a second connection device, the second connection device of the first or second connection module is configured to directly lock to the third connection device of the third connection module so that, in the locked state, the second connection device of the first or second connection module is electrically and mechanically connected to the third connection module, wherein the third connection device is disposed and implemented such that, when the second connection device and the third connection device are in the locked state, mechanical and electrical separations of the second connection device from the third connection module is prevented if the third connection module has received a device, and wherein the third connection module comprises a termination device enabling electrical contact elements of the first connection device to be interconnected.

10. A system, comprising:

the connection system of claim 1; and first and second devices, wherein the first device is configured to be coupled to the first connection module and the second device is configured to be coupled to the second connection module.

11. The system of claim 10, wherein the first device is a basic module and the second device is an expansion module, and wherein in the coupled state of the basic module to the first connection module, of the expansion module to the second connection module and of the first connection module to the second connection module, the basic module is configured to output an electrical signal to the expansion module via the first and second connection modules.

12. The system of claim 11, wherein the first and second devices, each comprise a circuit board including an electrically conductive contact surface, and wherein the accommodated device is in direct electrical contact with the first connection device via the electrically conductive contact surface.

13. The system of claim 11, wherein, in the region of the top-hat rail mount, the accommodated device includes a contact point configured to establish electrical contact between the accommodated device and the first connection device.

14. The system of claim 10, wherein the first and second devices each comprise a circuit board including an electrically conductive contact surface, and wherein the accommodated device is in direct electrical contact with the first connection device via the electrically conductive contact surface.

15. The system of claim 14, wherein, in the region of the top-hat rail mount, the accommodated device includes a contact point configured to establish electrical contact between the accommodated device and the first connection device.

16. The system of claim 10, wherein, in the region of the top-hat rail mount, the accommodated device includes a contact point configured to establish electrical contact between the accommodated device and the first connection point.

* * * * *